United States Patent [19]

Tamada et al.

[11] 4,358,752

[45] Nov. 9, 1982

[54] ANALOG-TO-DIGITAL CONVERTER

[75] Inventors: Haruo Tamada, Yokohama; Osamu Kudo, Tokyo, both of Japan

[73] Assignee: Fujitsu Limited, Kawasaki, Japan

[21] Appl. No.: 208,385

[22] Filed: Nov. 19, 1980

[51] Int. Cl.³ ............................................. H03K 13/02
[52] U.S. Cl. ............................ 340/347 AD; 307/362
[58] Field of Search ................. 330/257; 307/362, 360; 340/347 AD

[56] References Cited

U.S. PATENT DOCUMENTS

| | | | |
|---|---|---|---|
| 3,688,209 | 8/1972 | Winkel | 330/257 |
| 3,717,821 | 2/1973 | Amemiya | 330/257 |
| 3,882,484 | 5/1975 | Brokaw | 340/347 AD |
| 4,035,784 | 7/1977 | Brown | 340/173 R |
| 4,095,164 | 6/1978 | Ahmed | 330/257 |
| 4,109,215 | 8/1978 | Comer | 330/257 |

FOREIGN PATENT DOCUMENTS 1207642  12/1965  Fed. Rep. of Germany .

OTHER PUBLICATIONS

Analog Devices Co., "Data Acquisition Product Catalog", 1978, pp. 289–294.

Primary Examiner—C. D. Miller
Attorney, Agent, or Firm—Staas & Halsey

[57] ABSTRACT

A differential amplifier, which is associated with a digital-to-analog converter and a register and serves as an element of an analog-to-digital converter, having the offset input voltage characteristic determined by selecting, for example, the ratio of the emitter areas of a first pair of transistors so that no offset characteristic is required for the digital-to-analog converter associated with the differential amplifier. The offset input voltage can also be determined by selecting the ratio of the emitter areas of a second pair of transistors each one of the second pair of transistors connected to a different one of the first transistors and each one of the second pair of transistors having a current source of the same magnitude. The offset characteristic can also be determined by selecting unequal magnitudes of the current sources connected to the second pair of transistors when the ratio of the second pair of transistor emitter areas are equal. The offset characteristic can also be selected by selecting both the second pair of transistors emitter areas ratios and the second transistor current source magnitudes as not equal or by selecting any combination of the above current magnitudes or emitter area ratios.

7 Claims, 14 Drawing Figures

ANALOG-TO-DIGITAL CONVERTER

BACKGROUND OF THE INVENTION

The present invention relates to an analog-to-digital converter using a differential amplifier and a digital-to-analog converter.

BACKGROUND ART

Figure 1:
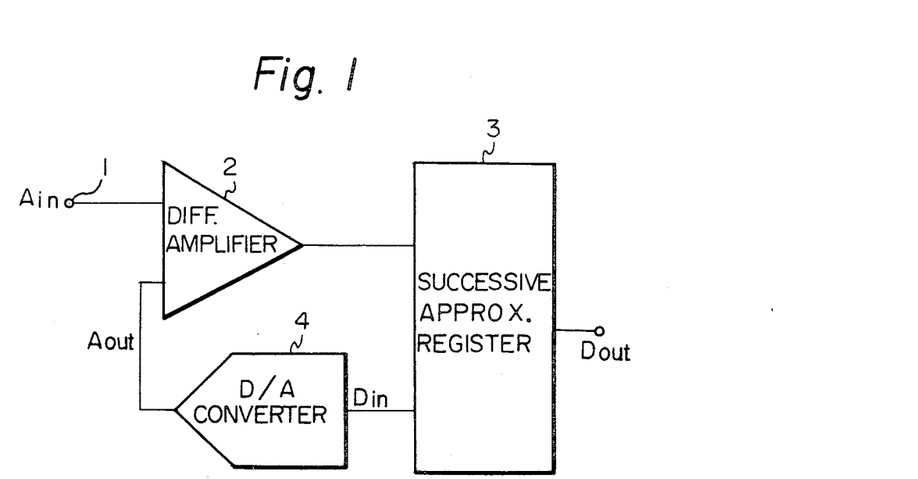
FIG. 1 illustrates in general an analog-to-digital converter comprising a differential amplifier, a register and a digital-to-analog converter.
Figure 2:
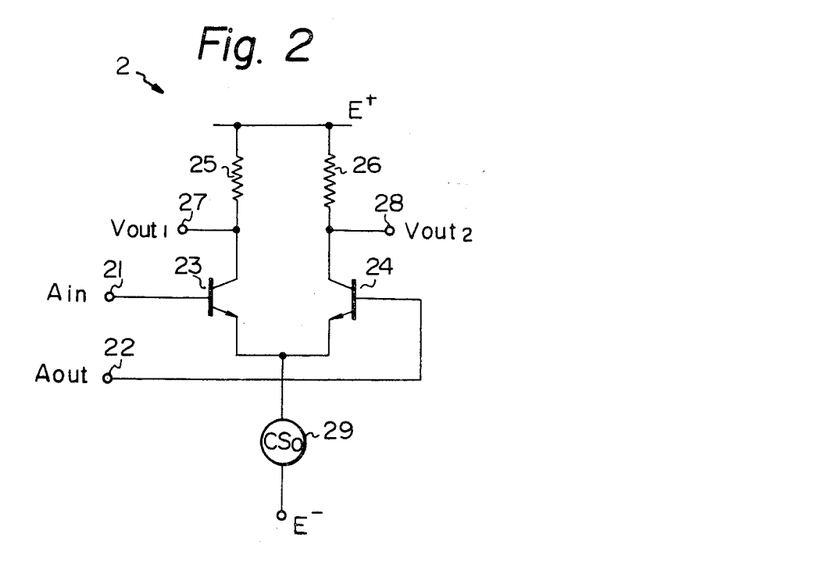
FIG. 2 illustrates a circuit diagram of the differential amplifier used in the device of FIG. 1.

In general, as illustrated in FIG. 1, an analog-to-digital converter using a differential amplifier and a digital-to-analog converter comprises a differential amplifier 2 receiving an analog input $A_{in}$ and an analog output $A_{out}$ of a digital-to-analog converter 4; a digital-to-analog converter 4; and a successive approximation register 3 for receiving the output of the differential amplifier 2 and supplying a digital output to the digital-to-analog converter 4. The circuit of the differential amplifier 2 is illustrated in FIG. 2. The differential amplifier 2 comprises a pair of emitter-connected transistors 23 and 24, load resistors 25 and 26, and a current source ($CS_0$) 29. The voltage $V_{in}$ applied across the input terminals 21 and 22 is equal to the difference "$A_{in} - A_{out}$", where $A_{in}$ is the signal applied to a first input terminal 21 and $A_{out}$ is the signal applied to a second input terminal 22.

In prior art analog-to-digital-converters, a differential amplifier is used in which the structure and the operative characteristics of the transistor 23 are the same as those of the transistor 24. The resistance of the resistor 25 is the same as that of the resistor 26. The two inputs which are to be compared are supplied to the input terminals 21 and 22. The differential amplifier 2 produces an output $V_{out}$ which is the difference between the potential $V_{out1}$ at the terminal 27 and the potential $V_{out2}$ at the terminal 28.

Figure 4A:
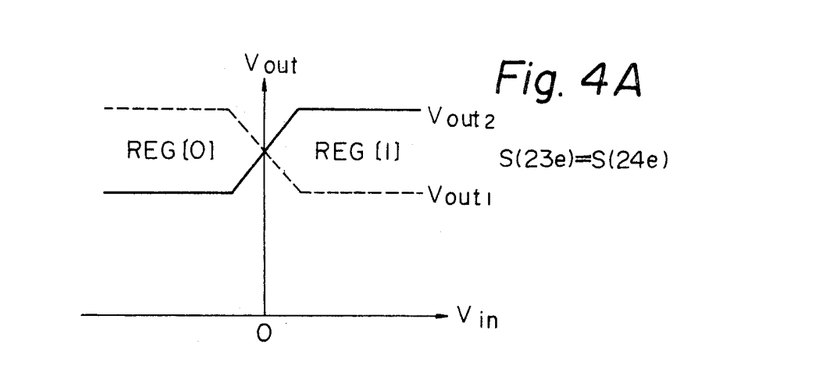
FIGS. 4A, 4B and 4C illustrate the relationships between $V_{in}$ and $V_{out}$ of the differential amplifier of FIG. 1.

The relationship between the voltage difference $V_{in}$ in the inputs and the output voltage $V_{out}$ of the differential amplifier 2 in prior art analog-to-digital converters is illustrated in FIG. 4A.

Figure 3:
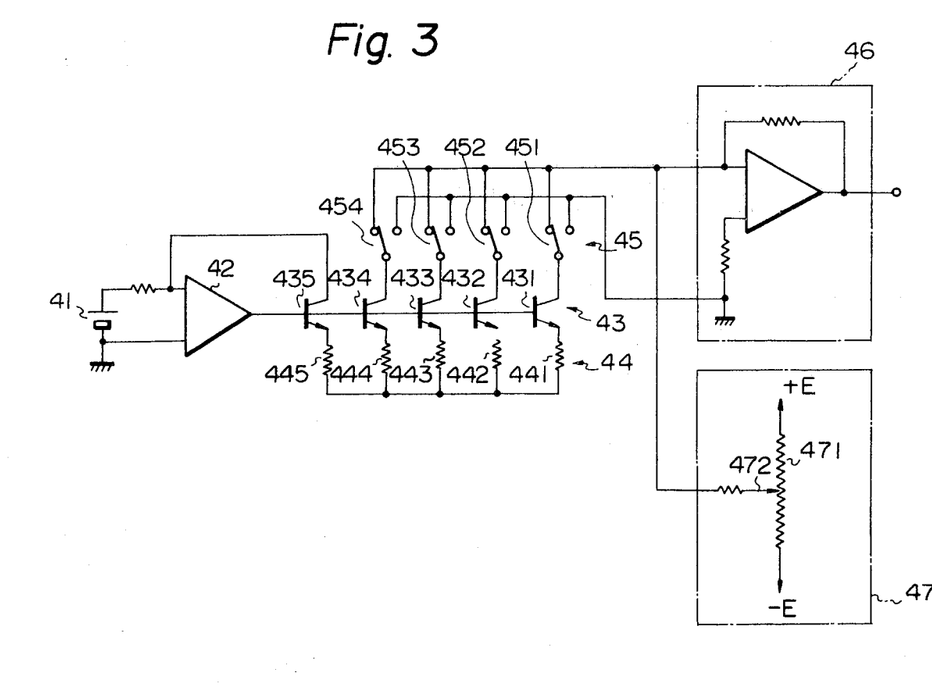
FIG. 3 illustrates a circuit diagram of the digital-to-analog converter used in the prior art analog-to-digital converter of the type of FIG. 1.

In prior art analog-to-digital converters of the type of FIG. 1, a digital-to-analog converter illustrated in FIG. 3 is used in order to obtain the offset characteristic of the digital-to-analog converter. The digital-to-analog converter of FIG. 3 comprises a reference voltage source 41, a control amplifier 42, a set of transistors 43, a set of resistors 44, a set of switches 45, a current-to-voltage converter 46 and an offset control circuit 47. The offset control circuit 47 consists of a potentiometer 471. The digital-to-analog converter of FIG. 3 has the offset characteristic because of the existence of the offset control circuit 47.

However, the use of the digital-to-analog converter of FIG. 3 is disadvantageous, because it is necessary to provide the offset control circuit and also carry out the adjustment of the offset control circuit by adjusting the position of the slider 472 on the potentiometer 471.

The present invention is directed to eliminate the above described disadvantages in the prior art analog-to-digital converter using the digital-to-analog converter as illustrated in FIG. 3.

Prior art digital-to-analog converters for a successive approximation analog-to-digital converter are described in, for example, "Data Acquisition Products Catalog 1978", pages 289, through 294, published by ANALOG DEVICES Company.

SUMMARY OF THE INVENTION

In accordance with the present invention there is provided an analog-to-digital converter having a differential amplifier including a pair of transistors connected in a differential relationship, a register and a digital-to-analog converter for converting the digital output signal of the register, the analog output signal of said digital-to-analog converter being applied to one input terminal of the differential amplifier. The current density of the emitter current of one of the pair of transistors of the differential amplifier is made different from that of the other of the pair of transistors so that the differential amplifier operates with a predetermined offset voltage.

DESCRIPTION OF THE PREFERRED EMBODIMENTS

Figure 6:
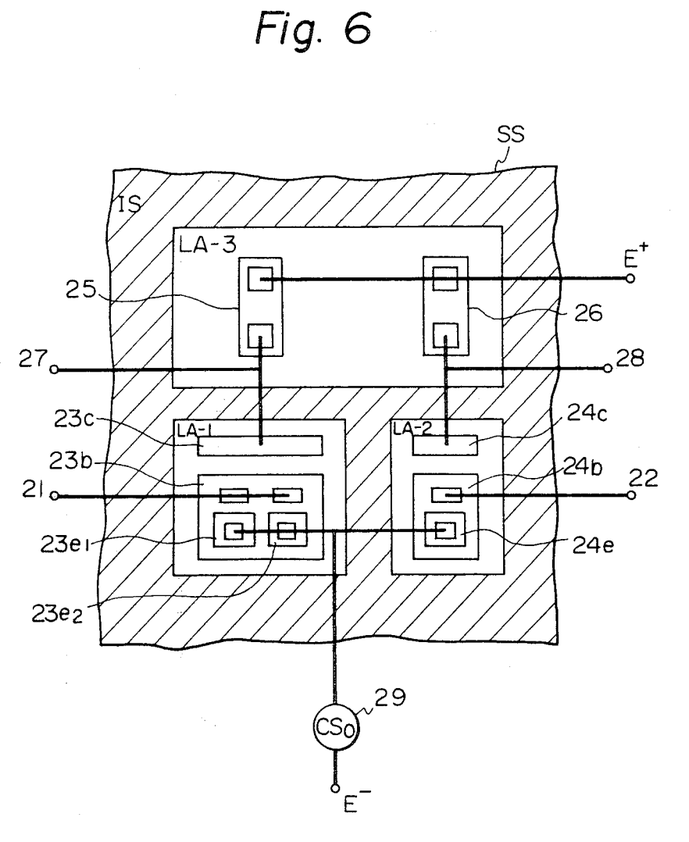
FIG. 6 illustrates the structure of the differential amplifier used in an analog-to-digital converter of an embodiment of the present invention.

An analog-to-digital converter of an embodiment of the present invention is illustrated in FIGS. 1, 2 and 6. It should be noted that the fundamental components of the analog-to-digital converter and the differential amplifier in accordance with the present invention are the same as those of the general analog-to-digital converter described in the BACKGROUND OF THE INVENTION of the present specification with reference to FIGS. 1 and 2. However, the pair of transistors 23 and 24 used in the differential amplifier of the present invention has the structure illustrated in FIG. 6.

The transistors 23 and 24 are formed in the land portions LA-1 AND LA-2 in the semiconductor substrate SS. The land portions LA-1 and LA-2 are separated from each other by the isolation portion IS. The transistor 23 comprises a base region 23b, a set of emitter regions 23e1 and 23e2, a collector region 23c and an input terminal 21. The transistor 24 comprises a base region 24b, an emitter region 24e, a collector region 24c and in input terminal 22.

In the structure of FIG. 6, each of the emitter areas 23e1 and 23e2 is the same as the emitter area 24e, and hence the entire emitter area of the transistor 23 is twice the emitter area of the transistor 24.

From the diode characteristic between the base and the emitter of each of the transistors 23 and 24, the offset input voltage $V_{in}$(OFS) which causes the output $V_{out}$ of the differential amplifier 2 to be zero (i.e. $V_{out} = V_{out1} - V_{out2} = 0$) is represented as follows.

$$V_{in}(OFS) = \frac{kT}{q} \ln \frac{\frac{I_1}{S(23e)}}{\frac{I_2}{S(24e)}} \quad (1)$$

In this equation (1), $I_1$ and $I_2$ are the currents passing through the resistors 25 ad 26, respectively, $S(23e)$ and $S(24e)$ are the emitter areas of the transistors 23 and 24, respectively, k is the Boltzmann Constant and T is the absolute temperature and q is the charge.

In accordance with the equation (1), it is possible to obtain a fixed value of the offset voltage $V_{in}(OFS)$ by selecting the ratio between the current density $$\frac{I_1}{S(23e)}$$

of the emitter current of the transistor 23 and the current density $$\frac{I_2}{S(24e)}$$

of the emitter current of the transistor 24.

If the currents $I_1$ and $I_2$ are equal, the equation (1) is represented as follows.

$$V_{in}(OFS) = \frac{kT}{q} \ln \frac{S(24e)}{S(23e)} \quad (2)$$

For example, in the embodiment of FIG. 6, it is possible to obtain a fixed value of the offset voltage $V_{in}(OFS)$ as represented by the equation (2), because the ratio between $S(24e)$ and $S(23e)$ is equal to 1:2.

Figure 4B:
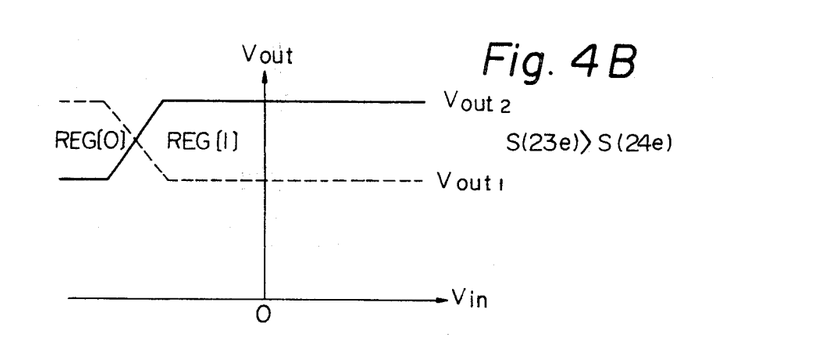
Figure 4C:
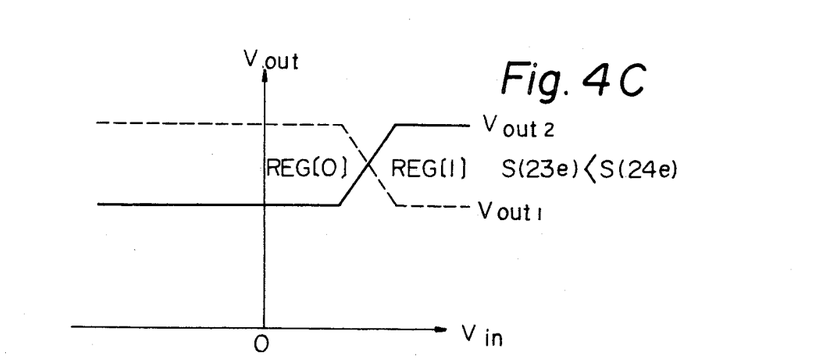

Accordingly, the relationship between the input voltage difference $V_{in}$ and the output voltage $V_{out}$ of the differential amplifier 2 is illustrated in FIG. 4B. Contrary to this, if the emitter area of the transistor 24 is greater than that of the transistor 23, the relationship will be as illustrated in FIG. 4C.

Figure 7A:
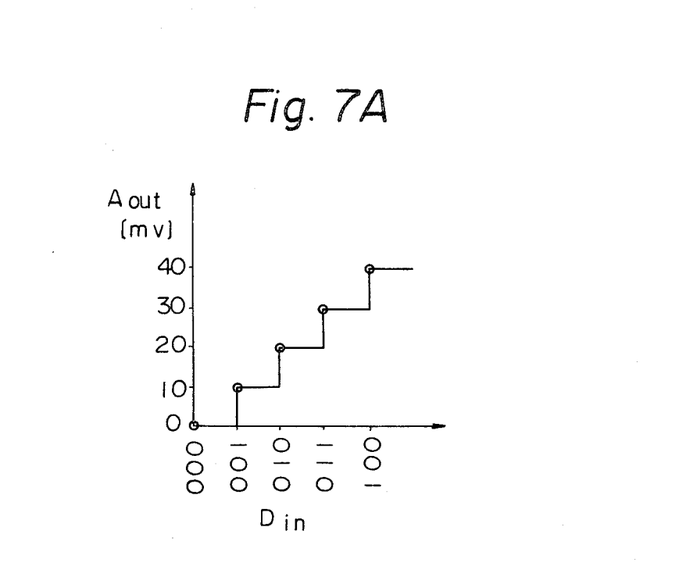
FIGS. 7A, 7B and 7C illustrate the operation characteristics of an analog-to-digital converter of an embodiment of the present invention.
Figure 7B:
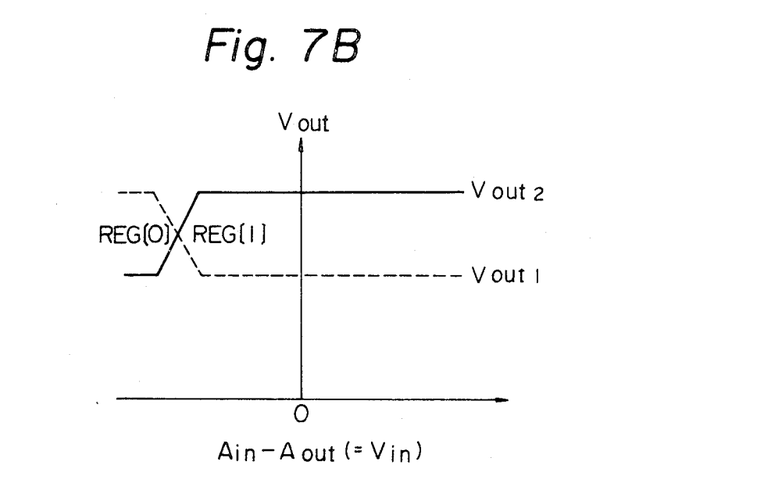
Figure 7C:
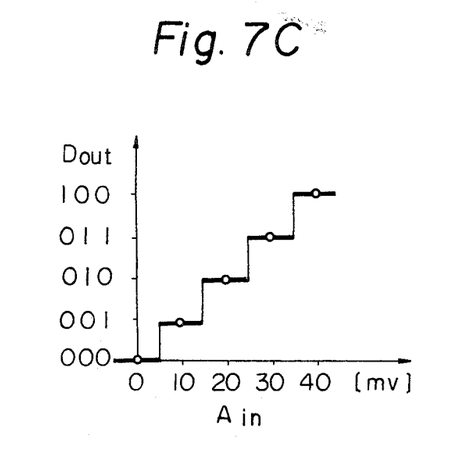

When the differential amplifier having the structure of FIG. 6 is used for the differential amplifier 2 of the analog-to-digital converter of FIG. 1, the operative characteristics of the elements of the analog-to-digital converter illustrated in FIGS. 7A, 7B and 7C are obtained. The relationship between the digital input $D_{in}$ and the analog output $A_{out}$ of the digital-to-analog converter 4 is illustrated in FIG. 7A. The relationship between the value "$A_{in} - A_{out}$", which is equal to $V_{in}$, and the $V_{out}$ in the differential amplifier 2 is illustrated in FIG. 7B. In the region REG[0], the differential amplifier 2 produces the output signal "0", while, in the region REG[1], the differential amplifier 2 produces the output signal "1".

Figure 5A:
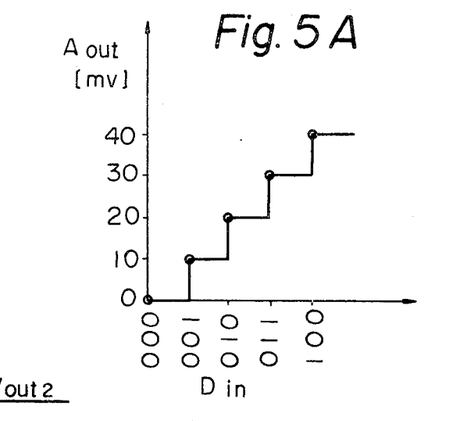
FIGS. 5A, 5B and 5C illustrate the operation characteristics of a prior art analog-to-digital converter.
Figure 5B:
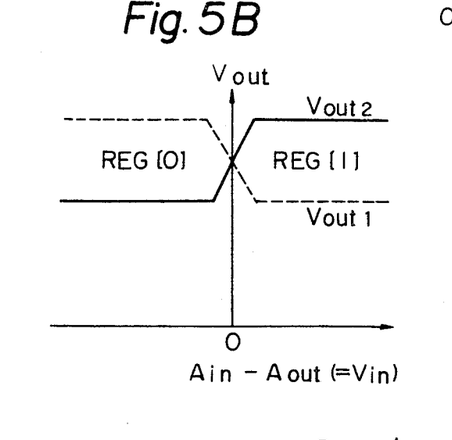
Figure 5C:
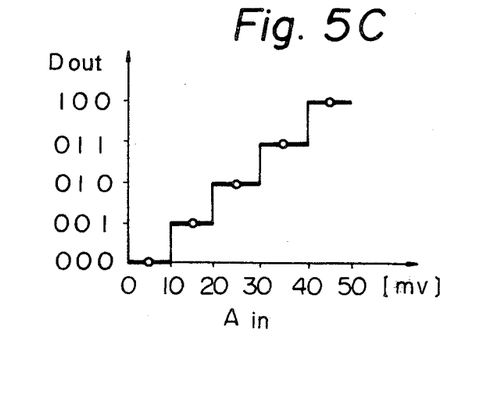

As a result of combining the characteristics of FIG. 7A with the characteristics of FIG. 7B, the resultant characteristic between the analog input $A_{in}$ and the digital output $D_{out}$ of the analog-to-digital converter of FIG. 1, illustrated in FIG. 7C, is obtained. It can be seen in FIG. 7C that the staircase line is shifted to the left by 5 mV as compared with the staircase line in FIG. 5C which is obtained by using the characteristic of FIG. 5B to which present invention is not applied.

Figure 8:
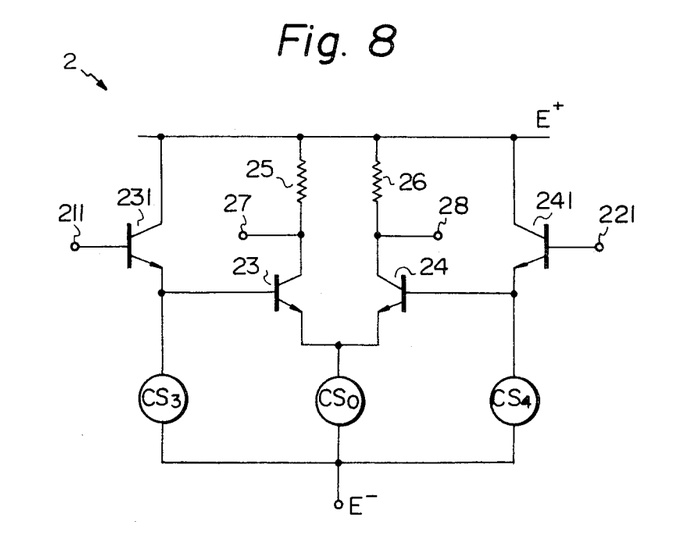
FIG. 8 illustrates another embodiment of the differential amplifier used in an embodiment of the present invention.

Another embodiment of the differential amplifier used in the analog-to-digital converter of FIG. 1 is illustrated in FIG. 8. In the circuit of FIG. 8, a third transistor 231, and a fourth transistor 241 are provided in addition to the first and second transistors 23 and 24. Also, additional current sources $CS_3$ and $CS_4$ are provided in the circuit of FIG. 8.

The offset input voltage $V_{in}(OFS)$ which causes the output $V_{out}$ of the differential amplifier 2 to be zero (i.e. $V_{out} = V_{out1} - V_{out2} = 0$) is represented as follows.

$$V_{in}(OFS) = \frac{kT}{q} \ln \frac{\frac{I_3}{S(231e)}}{\frac{I_4}{S(241e)}} \quad (3)$$

In this equation (3), $I_3$ and $I_4$ are the currents passing through the current sources $CS_3$ and $CS_4$, respectively, $S(231e)$ and $S(241e)$ are the emitter areas of the transistors 231 and 241, k is the Boltzman Constant and T is the absolute temperature and q is the charge.

In accordance with the equation (3), it is possible to obtain a fixed value of the offset voltage $V_{in}(OFS)$ by selecting the ratio between the current density $$\frac{I_3}{S(231e)}$$

of the emitter current of the transistor 231 and the current density $$\frac{I_e}{S(241e)}$$

of the emitter current of the transistor 241. Such selection can be carried out by selecting the ratio between $I_3$ and $I_4$ under the condition $S(231e) = S(241e)$, selecting the ratio between $S(231e)$ and $S(241e)$ under the condition $I_3 = I_4$ or selecting both the ratio between $I_3 = I_4$ and the ratio between $S(231e)$ and $S(241e)$.

We claim:

1. An analog-to-digital converter, operatively connectable to receive an analog input signal, comprising:
   a differential amplifier, having input terminals, one of which is operatively connectable to receive the analog input signal and an output terminal, including a pair of transistors operatively connected in a differential relationship each one of the transistors of said pair of transistors having an emitter, each one of the emitters having a different emitter area, the current density of the emitter current of one of said pair of transistors being made different from that of the other one of said pair of transistors by the difference in the emitter areas, and said differential amplifier operating with a predetermined offset voltage in dependence upon the emitter areas;
   a register having an input operatively connected to the output terminals of said differential amplifier and having output terminals for producing a digital output signal; and
   a digital-to-analog converter, operatively connected to one of the output terminals of said register, for converting the digital output signal of said register into an analog output signal, the analog signal of said digital-to-analog converter being applied to another one of the input terminals of said differential amplifier.

2. An analog-to-digital converter, operatively connectable to receive an analog input signal, comprising:
    a differential amplifier, having input terminals one of which is operatively connectable to receive the analog input signal and an output terminal, including a pair of transistors operatively connected in a differential relationship, each of the transistors of said pair of transistors having a base, said differential amplifier further including additional transistors, each of said additional transistors having an emitter, each one of the emitters having a different emitter area, for controlling the base currents of said pair of transistors, the current density of the emitter current of one of said additional transistors being made different from that of the other of said additional transistors by the difference in emitter areas, and said differential amplifier operating with a predetermined offset voltage in dependence upon the different emitter areas;
    a register having an input operatively connected to the output terminal of said differential amplifier and having output terminals for producing a digital output signal; and
    a digital-to-analog converter, operatively connected to one of the output terminals of said register, for converting the digital output signal from said register into an analog output signal, the analog output signal being applied to another one of the input terminals of said differential amplifier.

3. An analog-to-digital converter, operatively connectable to receive an analog input signal and operatively connected to first and second reference voltages, comprising:
    a register, having an input and an output, for generating a digital signal;
    a digital-to-analog converter, having an input operatively connected to receive the digital signal, for converting the digital signal to an analog output signal, and for providing the analog output signal as an analog output; and
    a differential amplifier, having a first input operatively connected to receive the analog output signal, having a second input operatively connectable to receive the analog input signal, and having an output operatively connected to the input of said register, for generating a voltage output signal, and for generating a fixed value offset voltage, including:
    a current source having a first terminal operatively connected to the first reference voltage and having a second terminal;
    a first transistor having a first terminal operatively connected to receive the analog input signal, having a second terminal, and having a third terminal operatively connected to the second terminal of said current source, said third terminal being an emitter having a first emitter area;
    a second transistor having a first terminal operatively connected to receive the analog output signal, having a second terminal, and having a third terminal operatively connected to the second terminal of said current source, said third terminal being an emitter having a second emitter area;
    a first resistor operatively connected between the second terminal of said first transistor and the second reference voltage; and
    a second resistor, operatively connected between the second terminal of said second transistor and the second reference voltage;
    the voltage output signal being the difference between the potentials of the second terminals of said first and second transistors, and the fixed value offset voltage being generated in dependence upon the difference in the area of the first and second emitter areas.

4. An analog-to-digital converter, operatively connected to first and second reference voltages and operatively connectable to receive an analog input signal, comprising:
    a register, having an input and an output, for generating a digital signal;
    a digital-to-analog converter, having an input operatively connected to receive the digital signal and having an output, for converting the digital signal to an analog output signal; and
    a differential amplifier, having a first input operatively connected to receive the analog output signal, having a second input operatively connectable to receive the analog input signal and having an output operatively connected to the input of said register, for generating a voltage output signal, including:
    first through third current sources, each having a first terminal operatively connected to the first reference voltage and each having a second terminal;
    first and second transistors, each having first through third terminals, the third terminals of said first and second transistor operatively connected to the second terminal of said second current source, the voltage output signal being the difference between the potentials of the second terminals of said first and second transistors;
    a first resistor, operatively connected between the second terminal of the first transistor and the second reference voltage;
    a second resistor operatively connected between the second terminal of said second transistor and the second reference voltage;
    a third transistor having a first terminal operatively connectable to receive the analog input signal, having a second terminal operatively connected to the second reference voltage, having a third terminal operatively connected to both the second terminal of said first current source and the first terminal of said first transistor and having a first emitter area; and
    a fourth transistor having a first terminal operatively connected to receive the analog output signal, having a second terminal operatively connected to the second reference voltage, having a third terminal operatively connected to both the second terminal of said third current source and the first terminal of said second transistor and having a second emitter area different from the first emitter area, a fixed value offset voltage being generated in dependence upon the difference in the areas of the first and second emitter areas.

5. An analog-to-digital converter, operatively connected to first and second reference voltages and operatively connectable to receive an analog input signal, comprising:
    a register, having an input and an output, for generating a digital signal;

a digital-to-analog converter, having an input operatively connected to receive the digital signal and having an output, for converting the digital signal to an analog output signal; and a differential amplifier, having a first input operatively connected to receive the analog output signal, having a second input operatively connectable to receive the analog input signal and having an output operatively connected to the input of said register, for generating a voltage output signal, including:

first through third current sources, each having a first terminal operatively connected to the first reference voltage and each having a second terminal, said first and third current sources generating first and second currents different in magnitude;

first and second transistors, each having first through third terminals, the third terminals of said first and second transistors operatively connected to the second terminal of said second current source, the voltage output signal being the difference between the potentials of the second terminals of said first and second transistors;

a first resistor, operatively connected between the second terminal of the first transistor and the second reference voltage;

a second resistor operatively connected between the second terminal of said second transistor and the second reference voltage;

a third transistor having a first terminal operatively connectable to receive the analog input signal, having a second terminal operatively connected to the second reference voltage and having a third terminal operatively connected to both the second terminal of said first current source and the first terminal of said first transistor; and a fourth transistor having a first terminal operatively connected to receive the analog output signal, having a second terminal operatively connected to the second reference voltage and having a third terminal operatively connected to both the second terminal of said third current source and the first terminal of said second transistor, a fixed value offset voltage being generated in dependence upon the difference between the magnitude of the first and second currents.

6. An analog-to-digital converter, operatively connected to first and second reference voltages and operatively connectable to receive an analog input signal, comprising:

a register, having an input and an output, for generating a digital signal;

a digital-to-analog converter, having an input operatively connected to receive the digital signal, and having an output, for converting the digital signal to an analog output signal; and a differential amplifier, having a first input operatively connected to receive the analog output signal, having a second input operatively connectable to receive the analog input signal and having an output operatively connected to the input of said register, for generating a voltage output signal, including:

first through third current sources, each having a first terminal operatively connected to the first reference voltage and each having a second terminal, said first and third current sources generating first and second currents different in magnitude;

first and second transistors, each having first through third terminals, the third terminals of said first and second transistors operatively connected to the second terminal of said second current source, the voltage output signal being the difference between the potentials of the second terminals of said first and second transistors;

a first resistor operatively connected between the second terminal of the first transistor and the second reference voltage;

a second resistor operatively connected between the second terminal of said second transistor and the second reference voltage;

a third transistor having a first terminal operatively connectable to receive the analog input signal, having a second terminal operatively connected to the second reference voltage, having a third terminal operatively connected to both the second terminal of said first current source and the first terminal of said first transistor and having a first emitter area; and a fourth transistor having a first terminal operatively connected to receive the analog output signal, having a second terminal operatively connected to the second reference voltage, having a third terminal operatively connected to both the second terminal of said third current source and the first terminal of said second transistor and having a second emitter area different from the first emitter area, a fixed value offset voltage being generated in dependence upon the difference in area of said first and second emitter areas and the difference in the magnitude of the first and second currents.

7. An analog-to-digital converter as recited in claims 4, 5 or 6, wherein the third terminals of said first and second transistors are emitters having third and fourth emitter areas, respectively, and the areas of the third and fourth emitters areas are different, the fixed value offset voltage being generated additionally in dependence upon the difference in area of said third and fourth emitter areas.

* * * * *

UNITED STATES PATENT AND TRADEMARK OFFICE
CERTIFICATE OF CORRECTION

PATENT NO. : 4,358,752
DATED : November 9, 1982
INVENTOR(S) : TAMADA ET AL.

It is certified that error appears in the above-identified patent and that said Letters Patent is hereby corrected as shown below:

Front page, between lines "[22]" and "[51]" insert
--[30] Foreign Application Priority Data Nov. 24, 1979
[JP] Japan ..... 54-152257--.

Column 2, line 8, "the" (first occurrence) should be --said--;
          line 8, "said" should be --the--.
  Column 4, line 39, after "." insert --In addition to the above combinations of emitter area ratios and current ratios, it is possible to additionally select the ratios of the emitter areas of transistors 23 and 24 as previously discussed.--;
          line 59, "terminals" should be --terminal--;
          line 65, after "analog" (second occurrence) insert --output--.
  Column 8, line 52, "emitters" should be --emitter--.

Signed and Sealed this

Twenty-second Day of March 1983

[SEAL]

Attest:

GERALD J. MOSSINGHOFF

Attesting Officer     Commissioner of Patents and Trademarks